(12) United States Patent
Xie

(10) Patent No.: US 8,860,898 B2
(45) Date of Patent: Oct. 14, 2014

(54) ARRAY SUBSTRATE AND LIQUID CRYSTAL DISPLAY

(75) Inventor: Zhenyu Xie, Beijing (CN)

(73) Assignee: Beijing Boe Optoelectronics Technology Co., Ltd., Beijing (CN)

(*) Notice: Subject to any disclaimer, the term of this patent is extended or adjusted under 35 U.S.C. 154(b) by 23 days.

(21) Appl. No.: 13/291,253

(22) Filed: Nov. 8, 2011

(65) Prior Publication Data

US 2012/0113366 A1     May 10, 2012

(30) Foreign Application Priority Data

Nov. 9, 2010  (CN) .................... 2010 2 0601738 U

(51) Int. Cl.
*G02F 1/1368* (2006.01)
*H01L 29/786* (2006.01)
(52) U.S. Cl.
USPC ............... 349/43; 349/110; 349/162; 257/59
(58) Field of Classification Search
USPC ........ 349/43, 110, 122, 138, 44, 162; 257/59, 257/72; 345/92
See application file for complete search history.

(56) References Cited

U.S. PATENT DOCUMENTS 5,742,365 A * 4/1998 Seo ................................ 349/43
2002/0038998 A1 * 4/2002 Fujita et al. .................. 313/495

FOREIGN PATENT DOCUMENTS

| KR | 20010004014 A | 1/2001 |
| KR | 1020060078131 A | 7/2006 |
| KR | 20080037242 A | 4/2008 |

OTHER PUBLICATIONS

Automated computer translation of KR 20080037242—Apr. 2008.*
Korean Office Action dated Feb. 20, 2013; Appln. No. 10-2008-0037242.
KIPO NOA dated Jul. 30, 2013; Appln. No. 10-2011-0116091.

* cited by examiner

*Primary Examiner* — Dung Nguyen
*Assistant Examiner* — Tai Duong
(74) *Attorney, Agent, or Firm* — Ladas & Parry LLP

(57) ABSTRACT

An array substrate is provided and it comprises a base substrate and data lines and gate lines that crossed with one another to define pixel units on the base substrate. Each pixel unit comprises a pixel electrode and a thin film transistor (TFT) switch, and the TFT switch comprises a gate electrode, a source electrode, a drain electrode and an active layer. A gate insulation layer is provided between the gate electrode and the active layer, and the gate insulation layer comprises a nontransparent insulation layer.

9 Claims, 6 Drawing Sheets

US 8,860,898 B2

ARRAY SUBSTRATE AND LIQUID CRYSTAL DISPLAY

BACKGROUND

Embodiments of the disclosed technology provide an array substrate and a liquid crystal display.

Liquid crystal displays are the commonly used flat panel displays at present, and thin film transistor liquid crystal displays (TFT-LCDs) are the main kind of liquid crystal displays. A TFT-LCD typically comprises an array substrate with an array structure.

FIG. 1A shows a partial top view of a typical array substrate, and FIG. 1B shows a cross sectional view taken along line A-A in FIG. 1A.

As shown in FIG. 1A and FIG. 1B, the array substrate manufactured with a conventional four-mask process generally comprises a base substrate 1 and data lines 5 and gate lines 2 that are crossed each other on the base substrate 1. The data lines 5 and the gate lines 2 collectively define a plurality of pixel units arranged in a matrix form, and each pixel unit comprises a thin film transistor (TFT) switch and a pixel electrode 11, and the TFT switch comprises a gate electrode 3, a source electrode 7, a drain electrode 8 and an active layer 6. For the pixel unit, the gate electrode 3 of the TFT is connected with one gate line 2, the source electrode 7 is connected with one data line 5, the drain electrode 8 is connected with the pixel electrode 11 of the pixel unit through a passivation hole 10, and the active layer 6 is formed between the source and the drain electrodes 7 and 8 and the gate electrode 3. A gate insulation layer 4 is formed between the gate electrode 3 and the active layer 6, a passivation layer 9 is formed between the pixel electrode 11 and the drain electrode 8, and the pixel electrode 11 is connected with the drain electrode 8 through the passivation layer via hole 10. The gate lines 2, the data lines 5, the gate electrodes 3, the source electrodes 7, the drain electrodes 8, the pixel electrodes 11 and the like can be collectively referred to as conductive patterns, while the gate insulation layer 4, the passivation layer 9 and the like can be collectively referred to as insulation layers.

A TFT-LCD needs an external light source, such as a backlight, for display; however, if the active layers of the TFTs on array substrate are illuminated by the backlight, the TFTs trend to give rise to leakage currents ($I_{off}$), which degrades display quality of the TFT-LCD, thus it is necessary to form a black matrix on the opposite substrate (e.g., a color filter substrate) to the array substrate, decreasing the aperture ratio of the TFT-LCD.

SUMMARY

An embodiment of the disclosed technology provides an array substrate, comprising: a base substrate, and data lines and gate lines that crossed with one another to define pixel units on the base substrate, wherein each pixel unit comprises a pixel electrode and a thin film transistor (TFT) switch, and the TFT switch comprises a gate electrode, a source electrode, a drain electrode and an active layer, and wherein a gate insulation layer is provided between the gate electrode and the active layer, and the gate insulation layer comprises a nontransparent insulation layer.

Another embodiment of the disclosed technology provides a liquid crystal display, comprising: a liquid crystal panel, which comprises the above-described array substrate and an opposite substrate, which are assembled together with a liquid crystal layer interposed therebetween.

Further scope of applicability of the disclosed technology will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Embodiments of the disclosed technology will be described clearly and completely in combination with the drawings of the embodiments of the disclosed technology, so as to make objects, technical solutions and advantages of the embodiments of the disclosed technology to be clearer. Obviously, the described embodiments are portion of the embodiments of the disclosed technology, not all the embodiments. Based on the embodiments of the disclosed technology, the other embodiments obtained by those skilled in the related art without giving inventive work belong to the scope of the disclosed technology.

First Embodiment

Figure 1A:
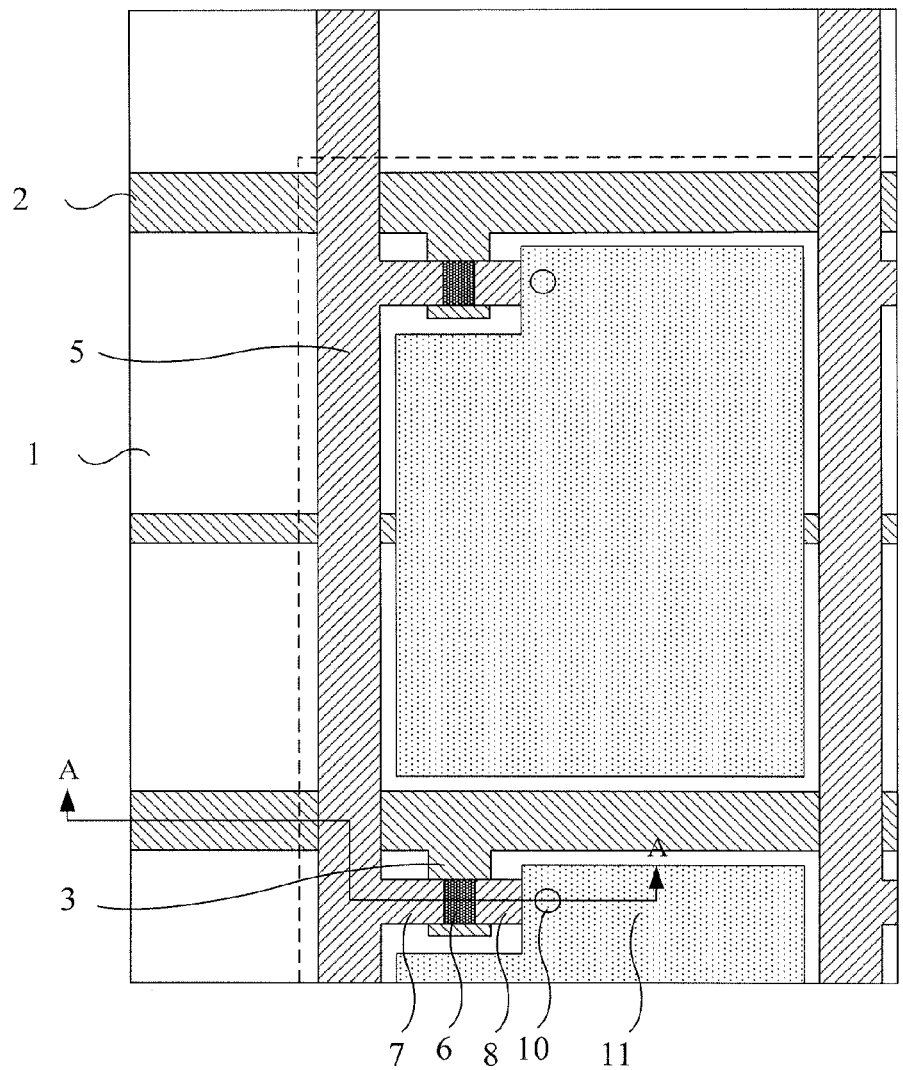
FIG. 1A shows a partial top view of a typical array substrate.
Figure 1B:
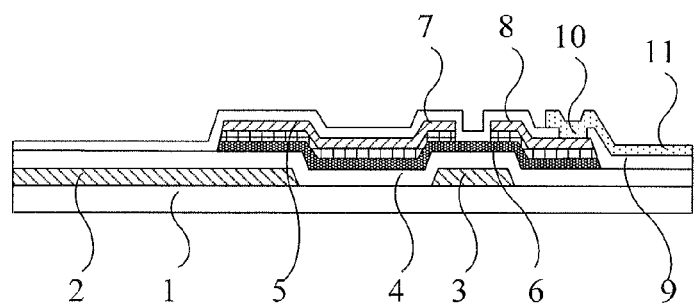
FIG. 1B shows a cross sectional view taken along line A-A in FIG. 1A.
Figure 2:
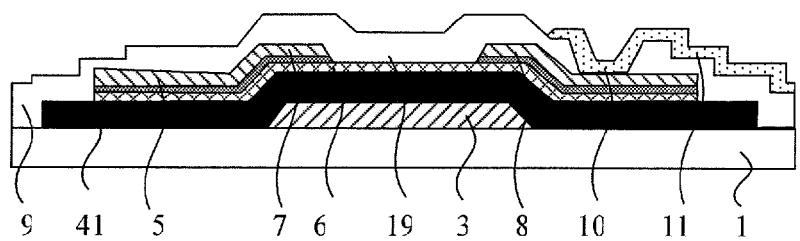
FIG. 2 shows a partial cross-sectional view of an array substrate according to a first embodiment of the disclosed technology embodiment.

FIG. 2 shows a partial cross-sectional view of an array substrate according to the first embodiment of the disclosed technology embodiment. As shown in FIG. 2, the array substrate comprises a base substrate 1, and on the base substrate 1 there are formed data lines 5 and gate lines (not shown), which are crossed with each other to define a plurality of pixel units; each pixel unit comprises a pixel electrode 11 and a thin film transistor (TFT) switch. Furthermore, each TFT switch comprises a gate electrode 3, a source electrode 7, a drain electrode 8, and an active layer 6; the gate electrode 3 is formed on the base substrate 1, the active layer 6 is formed on the gate electrode 3, and the source and drain electrodes 7 and 8 are formed on the active layer 6. Between the gate electrode 3 and the active layer 6, there is provided a gate insulation layer, and the gate insulation layer comprises a nontransparent insulation layer 41.

The gate insulation layer of the array substrate of the embodiment comprises a nontransparent insulation layer and therefore can prevent the backlight under or behind the array substrate from illuminating the active layers of the TFTs formed on the array substrate, alleviating the leakage currents of the TFTs. Therefore, the characteristics of the TFTs can be improved, and also light leakage from the backlight can be avoided, thus the area of the black matrix on the opposite substrate (e.g., color filter substrate) to the array substrate can be reduced, and the aperture ratio of the TFT-LCD can be increased.

Second Embodiment

Figure 3:
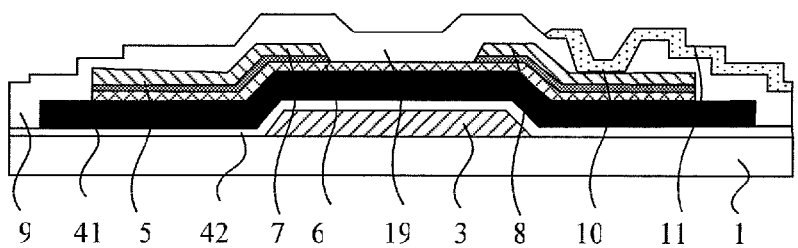
FIG. 3 shows a partial cross-sectional view of an array substrate according to a second embodiment of the disclosed technology embodiment.

FIG. 3 shows a partial cross-sectional view of an array substrate according to the second embodiment of the disclosed technology embodiment. As shown in FIG. 3, the array substrate comprises a base substrate 1, and on the base substrate 1 there are formed data lines 5 and gate lines (not shown), which are crossed with each other to define a plurality of pixel units; each pixel unit comprises a pixel electrode 11 and a thin film transistor (TFT) switch. Furthermore each TFT switch comprises a gate electrode 3, a source electrode 7, a drain electrode 8 and an active layer 6; the gate electrode 3 is formed on the base substrate 1, the active layer 6 is formed on the gate electrode 3, and the source and drain electrodes 7 and 8 are formed on the active layer 6. Between the gate electrode 3 and the active layer 6, there is provided a gate insulation layer, and the gate insulation layer comprises a nontransparent insulation layer 41. In addition, the gate insulation layer may further comprise a transparent insulation layer 42, and the transparent insulation layer 42 is formed under the nontransparent insulation layer 41.

Here, the gate electrode 3 is connected with one gate line, the source electrode 7 is connected with one data line 5, and the nontransparent insulation layer 41 corresponds to the data line 5, the source electrode 7, and the drain electrode 8 of the corresponding pixel unit, and accordingly the nontransparent insulation layer 41 and the transparent insulation layer 42 may also be provided under the data line 5.

In an example, the area of the nontransparent insulation layer is larger than that of the upper data line or the upper active layer. The nontransparent insulation layer 41 may comprise a black resin insulation layer. For example, the nontransparent insulation layer 41 may employ the same black resin material as that to form the black matrix on the opposite substrate (e.g., color filter substrate). The thickness of the nontransparent insulation layer made of a black resin insulation layer may be in the range of about 10000~20000 Å. Further, the thickness of the transparent insulation layer 42 may be in the range of 500~5000 Å.

The manufacturing method of the above-described array substrate of the embodiment may comprise the following steps.

Figure 4A:
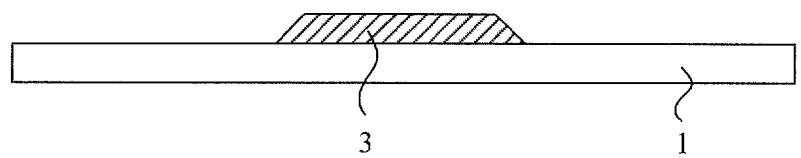
FIG. 4A shows a partial cross-sectional view of the gate lines and gate electrodes in manufacturing the array substrate according to the second embodiment of the disclosed technology.

Step 101, a gate metal thin film is formed on a base substrate 1 with a deposition process such as a magnetron sputtering method and patterned to form gate lines (not shown) and gate electrodes 3, as shown in FIG. 4A. FIG. 4A shows a partial cross-sectional view of the gate lines and gate electrodes in manufacturing the array substrate according to the second embodiment of the disclosed technology.

Figure 4B:
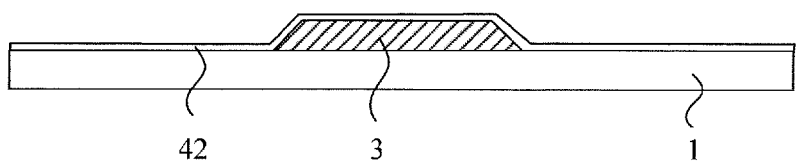
FIG. 4B shows a partial cross-sectional view of the transparent insulation layer in manufacturing the array substrate according to the second embodiment of the disclosed technology.

Step 102, on the base substrate 1 with the above patterns, a transparent insulation layer 42 is deposited with a plasma enhanced chemical vapor deposition (PECVD) method, and the material for the transparent insulation layer may be a transparent insulation layer, such as SiNx, and this transparent insulation layer 42 is a part of a gate insulation layer, as shown in FIG. 4B. FIG. 4B shows a partial cross-sectional view of the transparent insulation layer in manufacturing the array substrate according to the second embodiment of the disclosed technology.

Figure 4C:
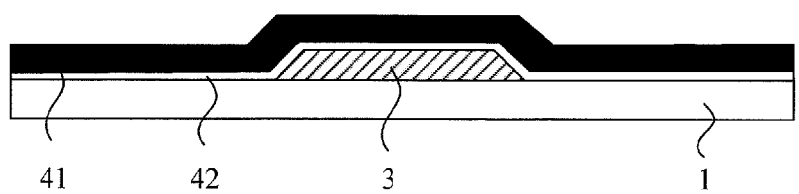
FIG. 4C shows a partial cross-sectional view of the nontransparent insulation layer in manufacturing the array substrate according to the second embodiment of the disclosed technology.

Step 103, on the base substrate 1 with the above patterns, a nontransparent insulation layer 41 is coated, and the material of the nontransparent insulation layer 41 may be a photosensitive or not, e.g., a black resin material, and then the coated nontransparent insulation layer 41 is solidified, and also the nontransparent insulation layer 41 is a part of the gate insulation layer, as shown in FIG. 4C. FIG. 4C shows a partial cross-sectional view of the nontransparent insulation layer in manufacturing the array substrate according to the second embodiment of the disclosed technology.

Figure 4D:
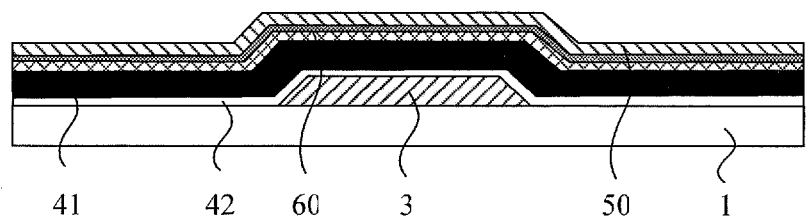
FIG. 4D shows a partial cross-sectional view of the active layer thin film and the data line metal thin film in manufacturing the array substrate according to the second embodiment of the disclosed technology.

Step 104, an active layer thin film 60 is formed by a PECVD method on the base substrate 1, and the active layer thin film 60 may comprise an amorphous semiconductor (a-si) thin film and a doped semiconductor ($n^+$a-si) thin film on the amorphous semiconductor thin film, and then a data line metal thin film 50 is formed by a magnetron sputtering method on the doped semiconductor thin film, as shown in FIG. 4D. FIG. 4D shows a partial cross-sectional view of the active layer thin film and the data line metal thin film in manufacturing the array substrate according to the second embodiment of the disclosed technology.

Step 105, a layer of photoresist is applied and then exposed with a double tone mask plate, such as a half tone or gray tone mask plate, and after development of the exposed photoresist, the stacked layers are patterned with wet and dray etching processes to obtain the active layer, the data line, the source electrode and the drain electrode of a TFT on the base substrate. The detailed process may comprise the following substeps.

Figure 5A:
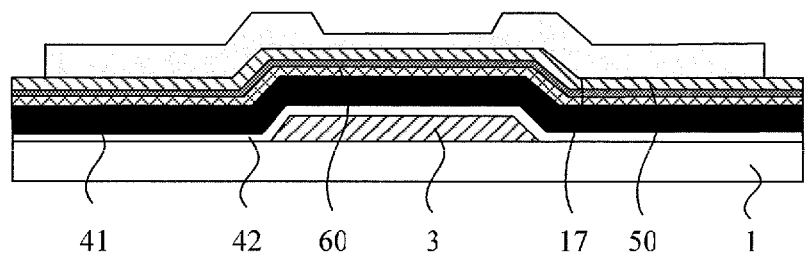
FIG. 5A shows a partial cross-sectional view of the exposed and developed photoresist coated on the data line metal thin film in manufacturing the array substrate according to the second embodiment of the disclosed technology.

Step 201, with a double tone mask plate, the layer of photoresist 17 coated on the data line metal thin film 50 is exposed and the exposed photoresist is developed to form a photoresist completely-retained region at the positions to form the source electrode, the drain electrode and the data line, a photoresist partially-retained region at the positions to form the channel region of the TFT and the gate line, and a photoresist completely-removed region in the remaining positions, as shown in FIG. 5A. FIG. 5A shows a partial cross-sectional view of the exposed and developed photoresist coated on the data line metal thin film in manufacturing the array substrate according to the second embodiment of the disclosed technology.

Figure 5B:
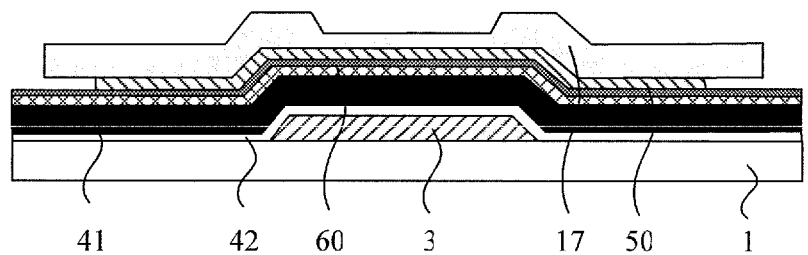
FIG. 5B shows a partial cross-sectional view of the etched data line metal thin film in manufacturing the array substrate according to the second embodiment of the disclosed technology.

Step 202, with a wet etching process, the data line metal thin film 50 corresponding to the photoresist completely-removed region is removed, as shown in FIG. 5B. FIG. 5B shows a partial cross-sectional view of the etched data line metal thin film in manufacturing the array substrate according to the second embodiment of the disclosed technology. After the data line metal thin film 50 corresponding to the photoresist completely-removed region is removed by etching, the data line portion of the metal thin film under the photoresist is partially overetched to obtain an undercut portion, forming the data line and the source electrode and the drain electrode of the TFT switch.

Figure 5C:
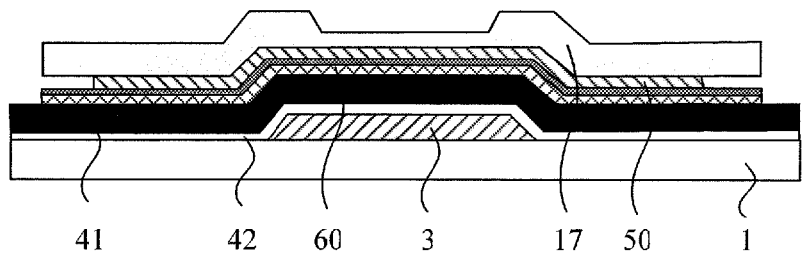
FIG. 5C shows a partial cross-sectional view of the etched active layer thin film in manufacturing the array substrate according to the second embodiment of the disclosed technology.

Step 203, with a dry etching process, the active layer thin film corresponding to the photoresist completely-removed region is removed, as shown in FIG. 5C. FIG. 5C shows a partial cross-sectional view of the etched active layer thin film in manufacturing the array substrate according to the second embodiment of the disclosed technology. The nontransparent insulation layer 41 and the transparent insulation layer 42 are under the remaining active layer thin film 60.

Figure 5D:
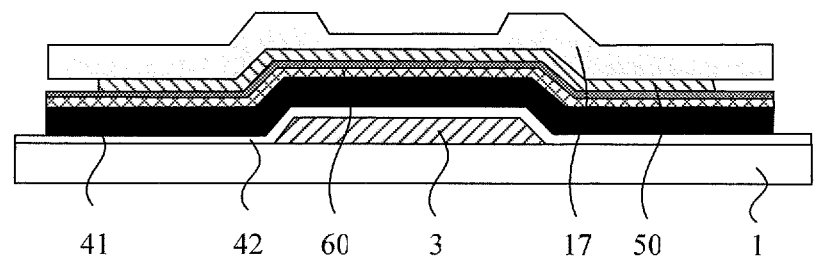
FIG. 5D shows a partial cross-sectional view of the etched nontransparent insulation layer in manufacturing the array substrate according to the second embodiment of the disclosed technology. embodiment of the disclosed technology.

Step 204, the portion of the nontransparent insulation layer 41 corresponding to the photoresist completely-removed region is removed, as shown in FIG. 5D. FIG. 5D shows a partial cross-sectional view of the etched nontransparent insulation layer in manufacturing the array substrate according to the second embodiment of the disclosed technology.

Figure 5E:
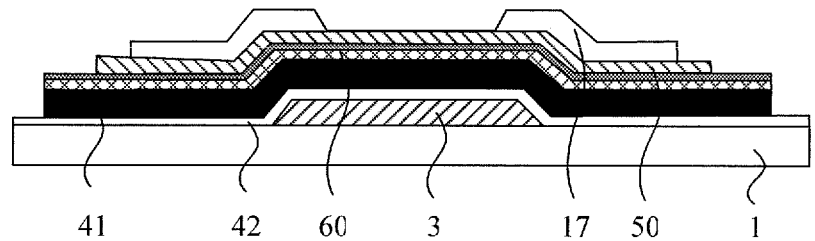
FIG. 5F shows a partial cross-sectional view of the further etched active layer thin film in manufacturing the array substrate according to the second embodiment of the FIG. 5E shows a partial cross-section view after ashing the photoresist layer in manufacturing the array substrate according to the second embodiment of the disclosed technology.
FIG. 5G shows a partial cross-sectional view of the formed source electrode and drain electrode in manufacturing the array substrate according to the second embodiment of the disclosed technology.
FIG. 5H shows a partial cross-sectional view of the formed channel region in manufacturing the array substrate according to the second embodiment of the disclosed technology.
FIG. 5I shows a partial cross-sectional view after removing the remaining photoresist in manufacturing the array substrate according to the second embodiment of the disclosed technology.

Step 205, with an ashing process, the photoresist in the photoresist partially-retained region is removed but the photoresist in the photoresist completely-retained region is retained with a reduced thickness, as shown FIG. 5E. FIG. 5E shows a partial cross-sectional view after ashing the photoresist layer in manufacturing the array substrate according to the second embodiment of the disclosed technology. In particular, the photoresist 17 in the channel region of the TFT and corresponding to the photoresist partially-retained region is removed by ashing, but the photoresist 17 at the positions of the data line, the source electrode and the drain electrode and corresponding to the photoresist completely-retained region is left with a reduced thickness.

Figure 5F:
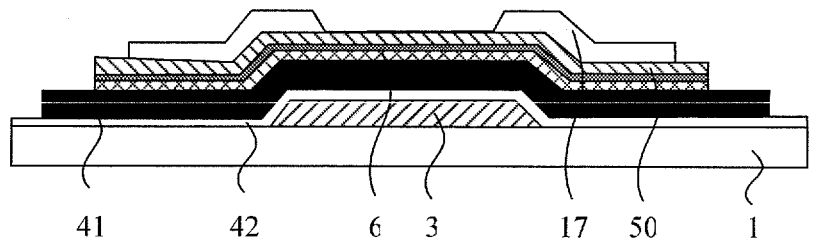

Step 206, after the photoresist is horizontally etched in the ashing process, the portion of the active layer thin film exposed from the edges of the data line metal thin film 50 is removed, as shown in FIG. 5F. FIG. 5F shows a partial cross-sectional view of the further etched active layer thin film in manufacturing the array substrate according to the second embodiment of the disclosed technology. After the exposed portion of the active layer thin film 60 is removed by etching, the pattern of the active layer 6 is formed, and the nontransparent insulation layer 41 is still left under the active layer 6, and the area of the nontransparent insulation layer 41 may be larger than that of the active layer 6, which can prevent the light from the backlight from illuminating the amorphous semiconductor thin film of the active layer.

Figure 5G:
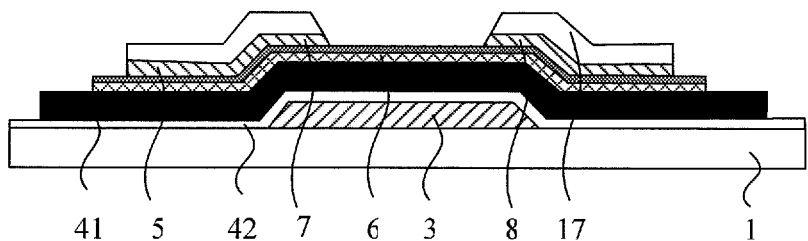

Step 207, with a metal dry etching process, for the data line metal thin film made of Mo for example, the data line metal thin film corresponding to the channel region of the TFT is removed, forming the data line 5, the source electrode 7 and the drain electrode 8, as shown in FIG. 5G. FIG. 5G shows a partial cross-sectional view of the formed source electrode and drain electrode in manufacturing the array substrate according to the second embodiment of the disclosed technology. Under the data line 5, there are left the active layer thin film and also the nontransparent insulation layer 41 and transparent insulation layer 42 of the gate insulation layer, and the positions of the nontransparent insulation layer 41 and the transparent insulation layer 42 correspond to the data line, the source electrode, and the drain electrode.

Figure 5H:
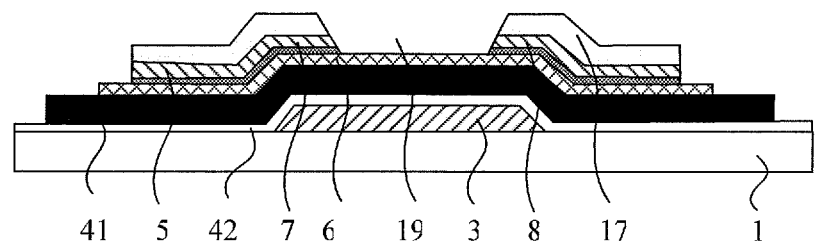

Step 208, the active layer corresponding to the channel region of the TFT is partially etched to form the TFT channel 19, as shown in FIG. 5H. FIG. 5H shows a partial cross-sectional view of the formed channel region in manufacturing the array substrate according to the second embodiment of the disclosed technology. In the channel region, the doped semiconductor layer 50 of the active layer 6 corresponding to the channel is removed, but the amorphous semiconductor 60 is partially etched in the thickness direction. Thus, the manufacturing of the TFT switch is completed here.

Figure 5I:
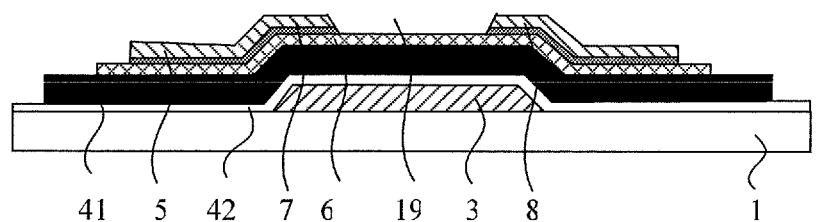

Step 209, the remaining photoresist is removed, as shown in FIG. 5I. FIG. 5I shows a partial cross-sectional view after removing the remaining photoresist in manufacturing the array substrate according to the second embodiment of the disclosed technology.

After the active layer 6, the TFT channel 19, the source electrode 7, the drain electrode 8, and data line 5 are formed through above-described Step 201 to Step 209, a pixel electrode is formed, as described in the below Step 106.

Step 106, a passivation layer 9 is formed by a deposition method and patterned to form a passivation layer via hole 10 therein, and then a pixel electrode conductive film is formed and patterned to form a pixel electrode 11, as shown in FIG. 3. This pixel electrode 11 is connected with the drain electrode 8 through the passivation layer via hole 10.

Each of the TFT on the array substrate of the embodiment employs a gate insulation layer comprises a nontransparent insulation layer (e.g., black resin insulation layer) as a part; further, the gate insulation layer may be of a two-layer configuration, the first layer of which is a transparent insulation layer (e.g., an inorganic material layer, such as SiNx) and the second layer is the nontransparent insulation layer. After a transparent insulation layer with a thickness of about 1000 Å is formed on the base substrate, a nontransparent insulation layer, such as a black resin insulation layer, is applied on the transparent insulation layer; then, the black resin insulation layer in the pixel region is patterned, and the black resin insulation layer (nontransparent insulation layer) is left under the active layer and therefore can prevent light from a backlight from illuminating the active layer of the TFT, capable of effectively reducing light leakage currents of the TFT and improving the characteristics of the TFT. Furthermore, the array substrate of the embodiment can prevent light leakage from the backlight, reduce the area of the black matrix on the opposite substrate, improve aperture ratio of the TFT-LCD. Moreover, with an area of the nontransparent insulation layer larger than the upper drain and source electrodes and the upper data line, the nontransparent insulation layer of the array substrate can be used to replace the black matrix on the opposite substrate, which can further improve the aperture ratio of the TFT-LCD.

Third Embodiment

Figure 6:
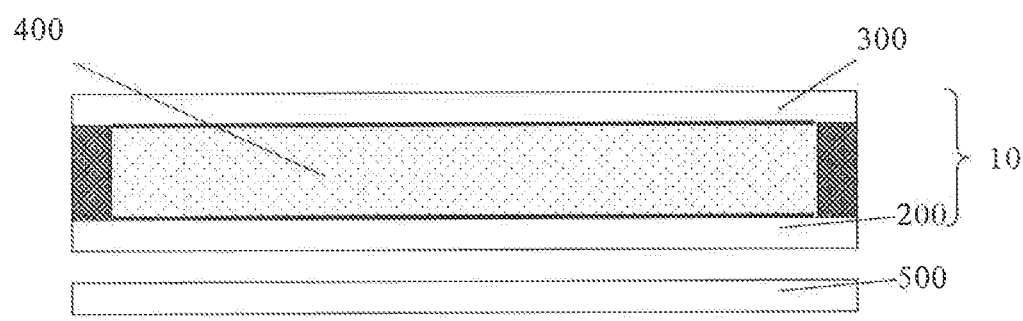
FIG. 6 shows a structural view of liuqid crystal display according to the third embodiment of the disclosed technology.

The third embodiment of the disclosed technology embodiment provides a liquid crystal display, which comprises a liquid crystal panel 10 as shown in FIG.6, and the liquid crystal panel 10 comprises an array substrate 200 according to anyone of the above-described embodiment, an opposite substrate 300, and a liquid crystal layer 400 interposed between the substrates. The opposite substrate 300 may be a color filter substrate, on which ROB (Red: Green: Blue) filter units are arranged for example; on the other hand, if the array substrate 200 comprises color filter units, the opposite substrate can comprise no color filter units.

In the array substrate 200 of the liquid crystal display of the embodiment, a gate insulation layer comprises a nontransparent insulation layer, which can prevent light from a backlight 500 from illuminating on the upper active layers of TFTs and reduces fight leakage current of the TFTs. Therefore, the characteristics of the TFTs can be improved, fight leakage from the backlight can be avoided, the area of the black matrix on the opposite substrate 300 can be reduced, and the aperture ratio of the liquid crystal display can be increased. In addition, the area of the nontransparent insulation layer of the gate insulation layer is larger than that of the upper data line and other elements of TFTs, thus light leakage from the backlight can be avoided further, and thus the nontransparent insulation layer can be used to replace the black matrix on the opposite substrate 300, increasing the aperture ration of the liquid crystal display.

The embodiment of the disclosed technology being thus described, it will be obvious that the same may be varied in many ways. Such variations are not to be regarded as a departure from the spirit and scope of the disclosed technology, and all such modifications as would be obvious to those skilled in the art are intended to be included within the scope of the following claims.

What is claimed is:

1. An array substrate, comprising:
   a base substrate, and
   data lines and gate lines that crossed with one another to define pixel units on the base substrate,
   wherein each pixel unit comprises a pixel electrode and a thin film transistor (TFT) switch, and the TFT switch comprises a gate electrode on the base substrate, a gate insulating layer on the gate electrode, an active layer on the gate insulating layer, and a source electrode and a drain electrode on the active layer, and
   wherein the gate insulating layer comprises a nontransparent insulation layer and a transparent insulation layer under the nontransparent insulation layer, the nontransparent insulation layer contacts the active layer provided on the nontransparent insulation layer, a portion of a top surface of the nontransparent insulation lay at edges of the nontransparent insulation layer is exsposed by the active layer to form a step and an area of the nontransparent insulation layer is larger than that of the data line or the active layer formed on the nontransparent insulation layer.

2. The array substrate according to claim 1, wherein the nontransparent insulation layer corresponds to the data line, the source electrode, and the drain electrode of the TFT switch.

3. The array substrate according to claim 2, wherein an area of the nontransparent insulation layer is larger than that of the upper data line or the upper active layer.

4. The array substrate according to claim 1, wherein the nontransparent insulation layer is a black resin insulation layer.

5. The array substrate according to claim 2, wherein the nontransparent insulation layer is a black resin insulation layer.

6. The array substrate according to claim 1, wherein a thickness of the nontransparent insulation layer is in the range of about 10000~20000Å.

7. The array substrate according to claim 1, further comprising a passivation layer, which covers the thin film transistor and contacts the portion of the top surface of the nontransparent insulation layer at edges of the nontransparent insulation layer and exposed by the active layer.

8. A liquid crystal display, comprising:
   a liquid crystal panel, which comprises the array substrate according to 1 and an opposite substrate, which are assembled together with a liquid crystal layer interposed therebetween.

9. The liquid crystal display according to claim 8, wherein the opposite substrate is a color filter substrate.

* * * * *